United States Patent
Yang

(10) Patent No.: US 9,572,238 B2
(45) Date of Patent: Feb. 14, 2017

(54) TOUCH PANEL, TOUCH DISPLAY DEVICE AND METHOD FOR MANUFACTURING THE TOUCH PANEL

(71) Applicant: BEIJING BOE OPTOELECTRONICS TECHNOLOGY CO., LTD., Beijing (CN)

(72) Inventor: Shengji Yang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 541 days.

(21) Appl. No.: 13/975,796

(22) Filed: Aug. 26, 2013

(65) Prior Publication Data

US 2014/0092519 A1   Apr. 3, 2014

(30) Foreign Application Priority Data

Sep. 28, 2012   (CN) .......................... 2012 1 0370949

(51) Int. Cl.
| | |
|---|---|
| *G06F 3/041* | (2006.01) |
| *H05F 3/04* | (2006.01) |
| *H05K 3/10* | (2006.01) |
| *H05K 1/02* | (2006.01) |

(Continued)

(52) U.S. Cl.
CPC ................. *H05F 3/04* (2013.01); *G06F 3/044* (2013.01); *H05K 1/0259* (2013.01); *H05K 3/10* (2013.01); *G06F 2203/04103* (2013.01); *G06F 2203/04111* (2013.01); *H05K 1/0289* (2013.01); *H05K 1/116* (2013.01); *H05K 2201/09227* (2013.01);

(Continued)

(58) Field of Classification Search
CPC ............... G06F 3/044; H05F 3/04; H05F 3/10
USPC .......................................................... 345/173
See application file for complete search history.

(56) References Cited

U.S. PATENT DOCUMENTS

| | | | |
|---|---|---|---|
| 2011/0057887 A1* | 3/2011 | Lin ......................... | G06F 3/044 345/173 |
| 2012/0206403 A1* | 8/2012 | Wang .................. | G02F 1/13338 345/174 |
| 2012/0249436 A1* | 10/2012 | Choi ................... | G02F 1/13338 345/173 |

FOREIGN PATENT DOCUMENTS

| | | |
|---|---|---|
| CN | 101655755 A | 2/2010 |
| CN | 202838260 U | 3/2013 |

OTHER PUBLICATIONS

First Chinese Office Action dated Dec. 3, 2014; Appln. No. 201210370949.1.

* cited by examiner

*Primary Examiner* — Towfiq Elahi
(74) *Attorney, Agent, or Firm* — Ladas & Parry LLP

(57) ABSTRACT

The embodiments of the present invention disclose a touch panel, a touch display device and method for manufacturing the touch panel. The touch panel comprises a first electrode wire, a second electrode wire being intersected with the first electrode wire, wherein, the first electrode wire comprises first electrodes and a metal bridge for lapping adjacent first electrodes through a first through hole on the insulating layer, and the hole wall of the first through hole is provided with a first sharp corner; the second electrode wire comprises second electrodes, a connecting portion, a metal wire, and a conductive covering portion, one end of the metal wire is connected with the conductive covering portion through a second through hole on the insulating layer, and the hole (Continued)

wall of the second through hole is provided with a second sharp corner which is arranged to face the first sharp corner.

11 Claims, 5 Drawing Sheets

(51) Int. Cl.
 *G06F 3/044* (2006.01)
 *H05K 1/11* (2006.01)
(52) U.S. Cl.
 CPC ............... *H05K 2201/09272* (2013.01); *Y10T 29/49162* (2015.01)

TOUCH PANEL, TOUCH DISPLAY DEVICE AND METHOD FOR MANUFACTURING THE TOUCH PANEL

TECHNICAL FIELD

The embodiments of the present invention relate to a touch panel, a touch display device and method for manufacturing the touch panel.

BACKGROUND

The touch panel is used as an input medium, which is more convenient for the users in comparison to the keyboard and the mouse. According to different principles, the touch panel can be classified as resistive, capacitive, surface acoustic wave, infrared touch panel, etc.

The capacitive touch panel is formed of a layer of special transparent metal conductive material coating on a glass surface. When touched by a finger, the electric field on the touch panel surface will be affected, which is equivalent to changing the capacitance. The system determines the contact position through the detection of changing of the voltage and the capacitance, and then performs the operation.

As shown in FIG. 1 and FIG. 2, the existing capacitive touch panel usually includes a driving transparent electrode wire 51 and a detecting transparent electrode wire 52 arranged on a glass substrate 50, and the driving transparent electrode wire 51 and the detecting transparent electrode wire 52 are intersected with each other, and are separated from each other by an insulating layer 53 at the intersection, wherein the driving transparent electrode wire 51 includes driving transparent electrodes 51a and a metal bridge 51b, and the metal bridge 51b is used for lapping adjacent driving transparent electrodes 51a through the through holes 53a on the insulating layer 53.

During the production and transportation of the touch panel, the static electricity generated from the action of friction, pasting or removing the protective film or the static electricity attached from touching the objects with high electrostatic charge may have a high instantaneous voltage. In the existing capacitive touch panel, since the thickness of the portion of the transparent electrode metal filling the wall of the through hole is relatively thin with small resistance, and the cross-sectional area of the current path is small, the electrostatic breakdown is very likely to occur at the through hole, which causes damage and eventually leads to product defects.

SUMMARY

The object of the embodiments of the present invention provides a touch panel, a touch display device, and method for manufacturing the touch panel in order to resolve the technical problem in the prior art that the electrostatic breakdown is very likely to occur at the through hole, which causes damage, and eventually leads to product defects.

The touch panel of the embodiments of the present invention includes on the substrate a first electrode wire, a second electrode wire, and an insulating layer, the second electrode wire is intersected with the first electrode wire, and is separated from the first electrode wire by the insulating layer at the intersection, wherein, the first electrode wire comprises first electrodes and a metal bridge, the metal bridge is arranged at the intersection and is used for lapping adjacent first electrodes through a first through hole on the insulating layer, and the hole wall of the first through hole is provided with a first sharp corner;

the second electrode wire comprises second electrodes, a connecting portion, a metal wire and a conductive covering portion, the connecting portion is arranged at the intersection and is used for connecting adjacent second electrodes, one end of the metal wire is connected with the conductive covering portion through a second through hole on the insulating layer, the other end of the metal wire is connected with one of the second electrodes through a third through hole on the insulating layer, and the hole wall of the second through hole is provided with a second sharp corner which is arranged to face the first sharp corner.

The touch display device of the embodiments of the present invention comprises the touch panel according to the aforementioned technical solution.

The method for manufacturing the touch panel of the embodiments of the present invention includes forming patterns of a metal bridge and a metal wire on the substrate by the patterning process;

on the substrate formed with the patterns of the metal bridge and the metal wire, forming a pattern of an insulating layer by the patterning process, the insulating layer being provided with first through holes respectively opposite to two ends of the metal bridge, a second through hole and a third through hole respectively opposite to two ends of the metal wire, the hole wall of each of the first through holes being provided with a first sharp corner, the hole wall of the second through hole being provided with a second sharp corner which is arranged to face the first sharp corner;

on the substrate formed with the pattern of the insulating layer, forming patterns of first electrodes, second electrodes, a connecting portion, and a conductive covering portion by the patterning process, adjacent first electrodes being connected with the metal bridge through the first through holes, adjacent second electrodes being connected by the connecting portion, the conductive covering portion being connected with one end of the metal wire through the second through hole, the second electrode being connected with the other end of the metal wire through the third through hole;

forming a protective layer on the substrate formed with the patterns of the first electrodes, the second electrodes, the connecting portion, and the conductive covering portion, and forming a signal guiding connecting hole of the protective layer by the pattering process.

The manufacturing method of the touch panel of the invention, including:

forming first electrodes, second electrodes, a connecting portion and conductive covering portion patterns on the substrate through the pattering process;

on the substrate formed with the patterns of the first electrodes, the second electrodes, the connecting portion, and the conductive covering portion, forming a pattern of an insulating layer by the pattering process, the insulating layer being provided with a first through hole opposite to one of the first electrodes, a second through hole adjacent to the first through hole, and a third through hole opposite to one of the second electrodes, the hole wall of the first through hole being provided with a first sharp corner, and the hole wall of the second through hole being provided with a second sharp corner which is arranged to face the first sharp corner;

on the substrate formed with the pattern of the insulating layer, forming patterns of a metal bridge and a metal wire by the patterning process, the metal bridge being used for lapping adjacent first electrodes through the first through hole on the insulating layer, one end of the metal wire being connected with the conductive covering portion through the second through hole on the insulating layer, the other end of the metal wire being connected with the one of the second electrodes through the third through hole on the insulating layer;

forming a protective layer on the substrate formed with the patterns of the metal bridge and the metal wire, and forming a signal guiding connecting hole of the protective layer by the pattering process.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, and thus are not limitative of the invention.

DETAILED DESCRIPTION

The technical solutions of the embodiments of the invention will be described in a clearly and fully understandable way in connection with the drawings related to the embodiments of the invention. It is obvious that the described embodiments are just a portion but not all of the embodiments of the invention. According to the embodiments of the invention, all other embodiments obtained by those ordinary skilled in the art under the premise of without creative efforts are all intend to be within the scope of the invention.

Unless otherwise defined, the technical or scientific terms used herein shall have the general meanings understandable for those ordinarily skilled in the field of the present invention. "First", "second" and the like used in specification and claims of the patent application of the present invention do not show any order, number or importance, but are only used to distinguish different constituent portions. Likewise, the words such as "a", "an", "the" or similar shall not represent limitation of numbers, but mean existence of at least one. The phrases such as "include", "comprise" or similar intend to mean the elements or objects before such words cover or are equivalent to the elements or objects listed after such words, but other elements or objects are not exclusive. The phrases such as "connect", "connected" or similar are not limited to physical or chemical connection, but also include electrical connection, no matter directly or indirectly. The phrases such as "upper", "lower", "left", "right" and etc. shall be used only to represent relative positions, wherein when the absolute position of the described object is changed, the relative positions may be changed accordingly.

In order to resolve the technical problem in the prior art of easily arising electrostatic breakdown at the through hole of the insulating layer, causing damage, and eventually leading to product defects, the invention provides a touch panel, a touch display device and a method for manufacturing the touch panel.

Figure 1:
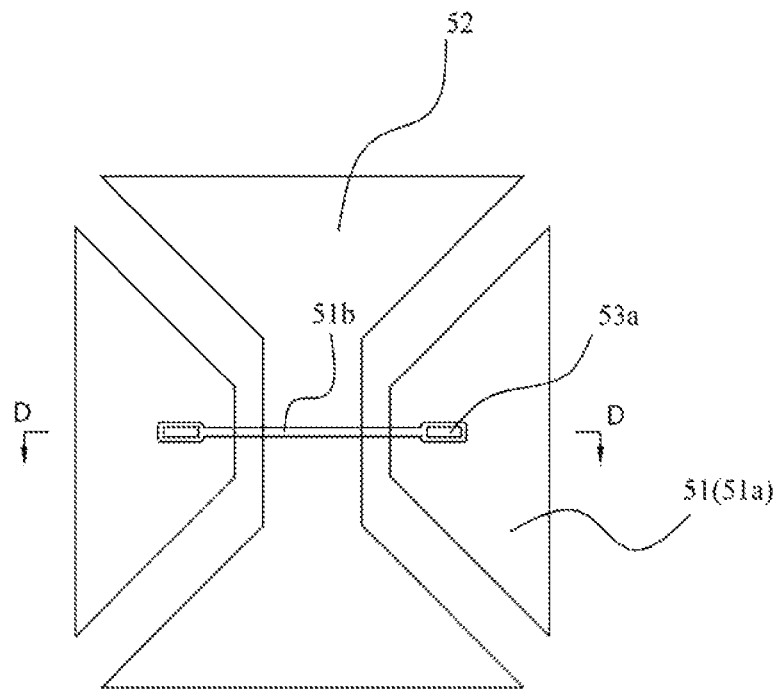
FIG. 1 is a planar schematic of the prior art capacitive touch panel.
Figure 2:
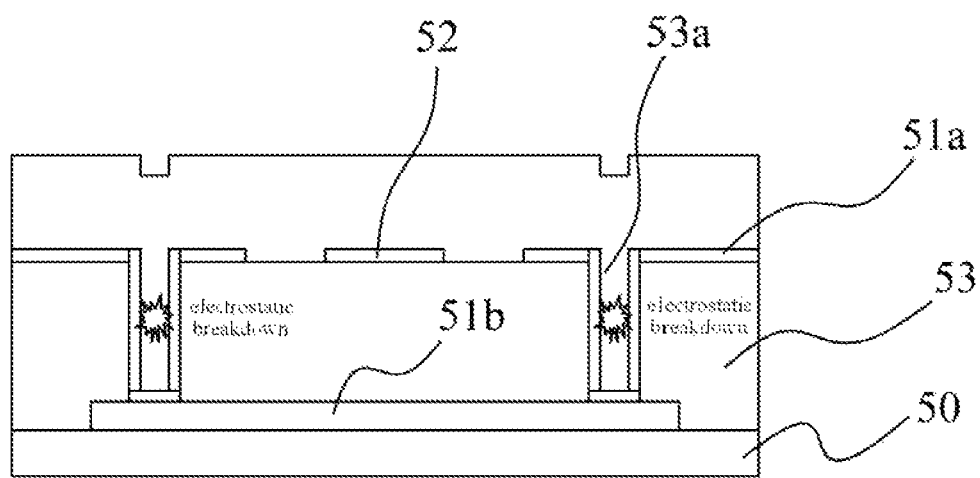
FIG. 2 is a cross-sectional schematic taken along D-D in FIG. 1.
Figure 3:
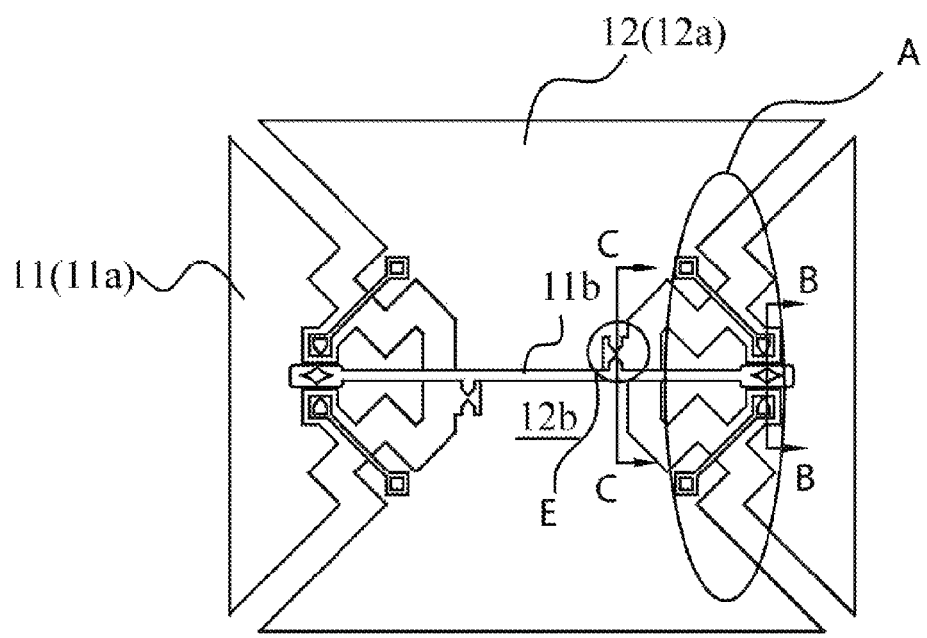
FIG. 3 is a planar schematic of the touch panel according to an embodiment of the invention.
Figure 4:
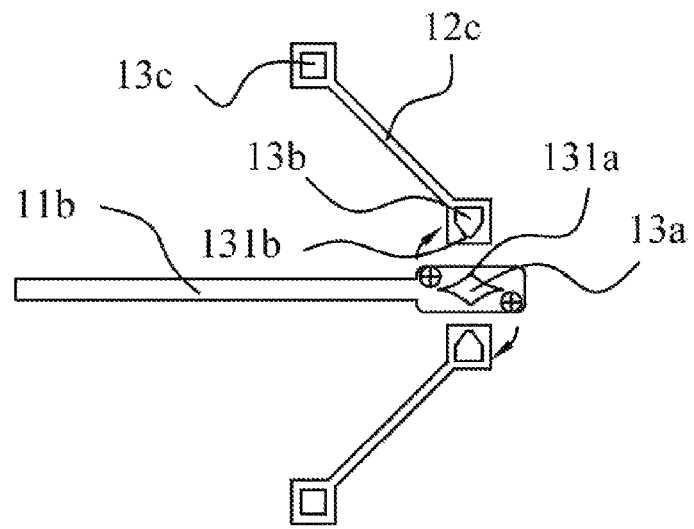
FIG. 4 is an enlarged schematic of the portion A in FIG. 3.
Figure 5:
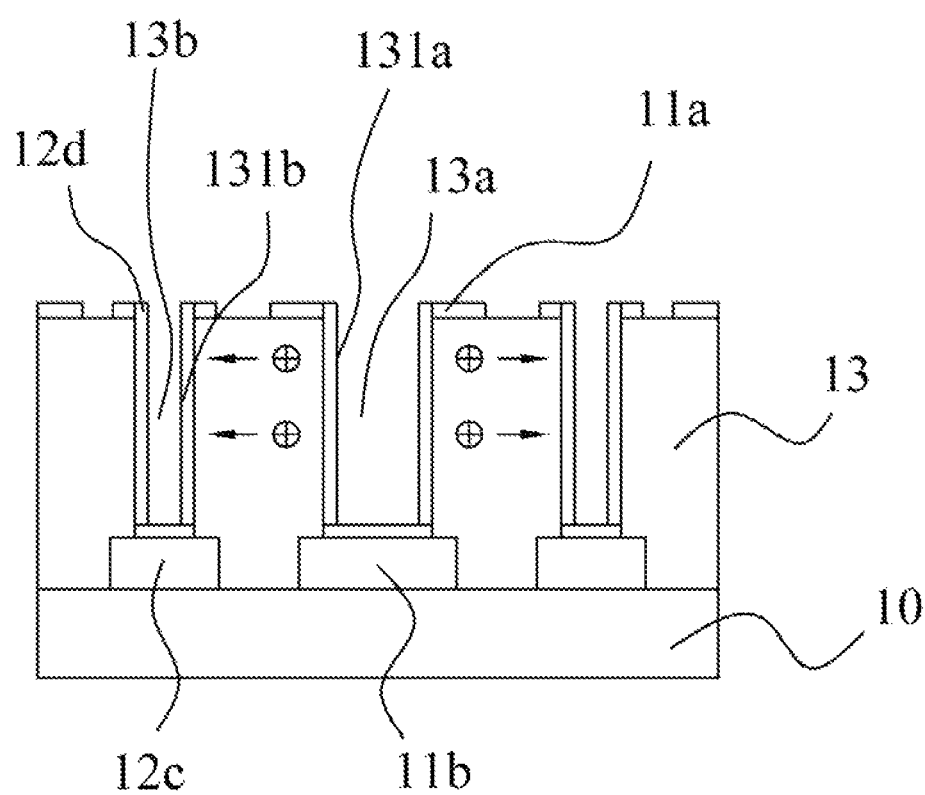
FIG. 5 is a cross-sectional schematic taken along B-B in FIG. 3.

As shown in FIG. 3 to FIG. 5, a touch panel of an embodiment of the present invention includes on a substrate 10 a first electrode wire 11, a second electrode wire 12 and an insulating layer 13, the second electrode wire 12 is intersected with the first electrode wire 11, and is separated from the first electrode wire 11 by the insulating layer 13 at the intersection, wherein, the first electrode wire 11 comprises first electrodes 11a and a metal bridge 11b, the metal bridge 11b is arranged at the intersection and is used for lapping adjacent first electrodes 11a through first through holes 13a on the insulating layer 13, and the hole wall of each of the first through holes 13a is provided with a first sharp corner 131a; the second electrode wire 12 comprises second electrodes 12a, a connecting portion 12b, a metal wire 12c and a conductive covering portion 12d, the connecting portion 12d is arranged at the intersection and is used for connecting adjacent second electrodes 12a, one end of the metal wire 12c is connected with the conductive covering portion 12d through a second through hole 13b on the insulating layer 13, the other end is connected with the second electrode 12a through a third through hole 13c on the insulating layer 13, and the hole wall of the second through hole 13b is provided with a second sharp corner 131b which is arranged to face the first sharp corner 131a.

In the technical solution of the embodiment of the present invention, since the hole wall of the first through hole 13a is provided with the first sharp corner 131a, the hole wall of the second through hole 13b is provided with the second sharp corner 131b which is arranged to face the first sharp corner 131a, the charges are released from the first sharp corner 131a and the second sharp corner 131b to the second electrode wire 12 according to the point discharge principle (the point discharge refers to a discharge phenomenon which occurs at the sharp part of an object under a strong electric field) when electrostatic charges are accumulated on the first electrode wire 11, which avoids damage at the first through hole 13a of the insulating layer 13 due to the electrostatic breakdown, and greatly improves the rate of qualified products.

Figure 6:
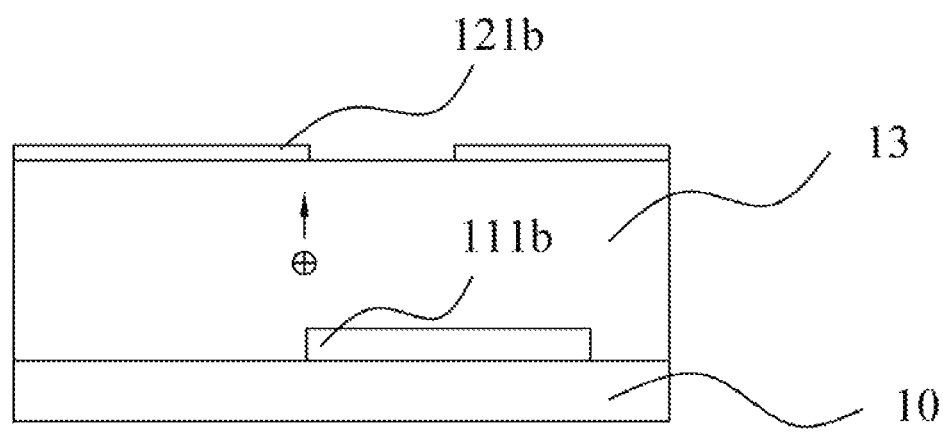
FIG. 6 is a cross-sectional schematic taken along C-C in FIG. 3.
Figure 7:
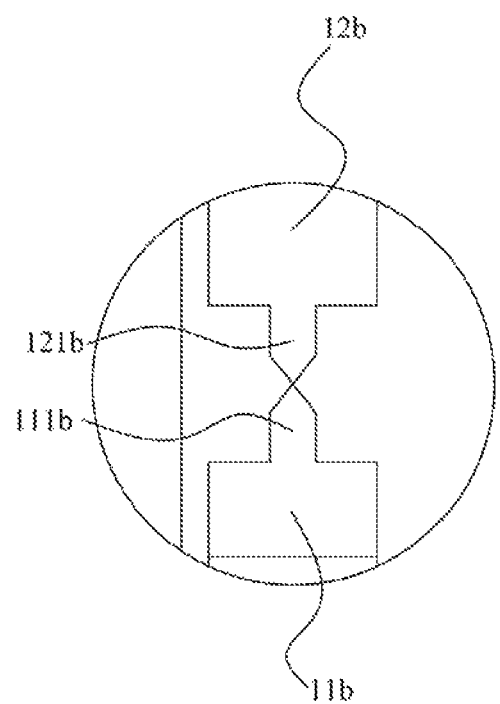
FIG. 7 is an enlarged schematic of the portion E in FIG. 3.

Due to the thickness of the insulating layer 13 of the touch panel is relatively thin (approximately 2000 angstroms, 1 angstrom=$10^{-10}$ m), it easily arises electrostatic breakdown at the intersection of the metal bridge 11b with the connecting portion 12b. Therefore, as shown in FIG. 6 and FIG. 7, preferably, for example, a third sharp corner 111b is provided on the metal bridge 11b, and a forth sharp corner 121b, which is arranged to face the third sharp corner 111b, is provided on the connecting portion 12b. The third sharp corner 111b and the forth sharp corner 121b are arranged in different layers, respectively. Likewise, according to the point discharge principle, the electrostatic charges can be released from the third sharp corner 111b and the forth sharp corner 121b to the second electrode wire 12 when the electrostatic charges are accumulated on the first electrode wire 11, which avoids the disconnecting injury of the metal bridge 11b due to the electrostatic breakdown. The material of the metal bridge 11b can be molybdenum (Mo), aluminum (Al), or copper (Cu), etc. The material of the insulating layer 13 can be silica, transparent organic polymers, or silicon nitride, etc.

In order to increase the discharge efficiency of the electrostatic charges through the first sharp corner 131a and the second sharp corner 131b which are arranged to face to each other, there may be several pairs, such as two or more pairs, of the first sharp corners 131a and second sharp corners 131b. Multiple point discharges (point discharge at a plurality of places) can release electrostatic charges to the second electrode wire 12 more quickly.

It is not limited for the specific shapes of the first sharp corner 131a and the second sharp corner 131b as long as they meet the requirement of the point discharge. In the embodiment shown in FIG. 3, two of first through holes 13a at both ends of the metal bridge 11b for connecting the metal bridge 11b with the first electrodes 11a are designed in a shape like rhombic. The second electrode wire 12 includes four metal wires 12c at the intersection, which are connected with four conductive covering portions 12d through four second through holes 13b, respectively, then each first through hole 13a is provided with two first sharp corners 131a, which are arranged to face two second sharp corners 131b of the second through hole 13b respectively. Therefore, there are totally four pairs of the first sharp corners 131a and second sharp corners 131b which are arranged to face to each other in the embodiment.

Similarly, in order to improve the discharge efficiency of the electrostatic charges through the third sharp corner 111b and the forth sharp corner 121b which are arranged to face to each other, there may be several pairs, such as two or more pairs, of the third sharp corners 111b and forth sharp corners 121b. In the embodiment as shown in FIG. 3, there are two pairs of the third sharp corners 111b and forth sharp corners 121b which are respectively arranged to face to each other. In addition, the number of the pairs of the third sharp corners 111b and the forth sharp corners 121b and the opposite area of the metal bridge 11b and the connecting portion 12b also determine the coupling capacitance at the intersection of the first electrode wire 11 with the second electrode wire 12. Therefore, in the manufacturing method of the product, the coupling capacitance is selectable.

In the touch panel of the embodiment of the present invention, the layer structure relationship of the respective portions is as follows: the metal bridge 11b and the metal wire 12c are formed on the substrate 10, the insulating layer 13 covers upon the metal bridge 11b and the metal wire 12c, and the first electrodes 11a, the second electrodes 12a, the connecting portion 12b and the conductive covering portion 12d are formed on the insulating layer 13. Here, the inner wall of the first through hole 13a is filled with a portion of metal of each first electrode 11a, the inner wall of the second through hole 13b is filled with the conductive covering portion 12d, and the inner wall of the third through hole 13c is filled with a portion of metal of each second electrode 12a.

In other embodiments of the present invention, the layer structure relationship of the respective portions also can be provided as: the first electrodes, the second electrodes, the connecting portion, and the conductive covering portion formed on the substrate, wherein the insulating layer covers upon the first electrodes, the second electrodes, the connecting portion, and the conductive covering portion, and the metal bridge and the metal wire are formed on the insulating layer. Here, the inner wall of the first through hole is filled with a portion of metal of the metal bridge, the inner wall of the second through hole is filled with the metal at one end of the metal wire, and the inner wall of the third through hole is filled with the metal at the other end of the metal wire.

The first electrode wire 11 can be a driving transparent electrode wire, then the second electrode wire 12 is a detecting transparent electrode wire, or, the first electrode wire 11 is the detecting transparent electrode wire, then the second electrode wire 12 is the driving transparent electrode wire. The material of the first electrode 11a and the second electrode 12a is generally indium tin oxide (ITO). The connecting portion 12b and the conductive covering portion 12d usually use the same material as that of the first electrode 11a and the second electrode 12a, and are formed in the same mask patterning process. Preferably, for example, the first electrode wire 11 is the driving transparent electrode wire, and the second electrode wire 12 is the detecting transparent electrode wire. This is because the resistance of the driving transparent electrode wire is often larger than that of the detecting transparent electrode wire, and connecting the metal bridge 11b to the first electrode 11a of the driving transparent electrode wire has the advantage of reducing the resistance.

In the touch panel of the embodiment of the invention, the hole wall of the first through hole is provided with a first sharp corner, the hole wall of the second hole is provided with a second sharp corner which is arranged to face the first sharp corner. According to the point discharge principle, the charges are released from the first sharp corner and the second sharp corner to the second electrode wire when electrostatic charges are accumulated on the first electrode wire, which avoids damage at the first through hole of the insulating layer due to the electrostatic breakdown, and greatly improves the rate of qualified products.

The touch display device of the embodiment of the present invention includes the touch panel in the aforementioned embodiments, which has better abilities to prevent electrostatic damage, and higher product qualification rate.

Figure 8:
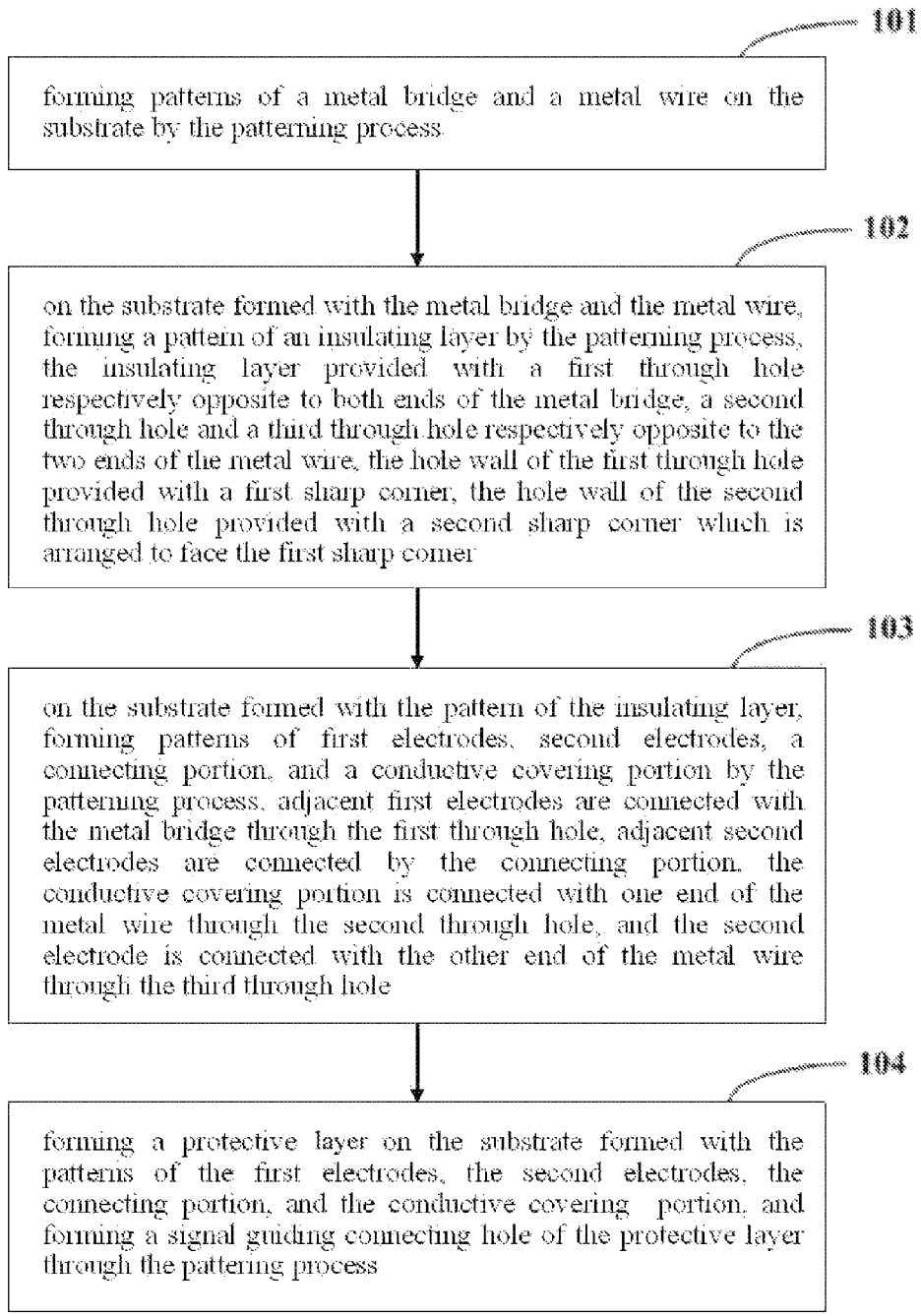
FIG. 8 is a flowchart of the method for manufacturing the touch panel according to an embodiment of the present invention.

As shown in FIG. 8, one embodiment of the method for manufacturing the touch panel of the embodiment of the present invention includes:

Step 101, forming patterns of a metal bridge and a metal wire on the substrate by the patterning process;

Step 102, on the substrate formed with the metal bridge and the metal wire, forming a pattern of an insulating layer by the patterning process, the insulating layer provided with a first through hole respectively opposite to both ends of the metal bridge, a second through hole and a third through hole respectively opposite to the two ends of the metal wire, the hole wall of the first through hole provided with a first sharp corner, the hole wall of the second through hole provided with a second sharp corner which is arranged to face the first sharp corner;

Step 103, on the substrate formed with the pattern of the insulating layer, forming patterns of first electrodes, second electrodes, a connecting portion, and a conductive covering portion by the patterning process, adjacent first electrodes are connected with the metal bridge through the first through hole, adjacent second electrodes are connected by the connecting portion, the conductive covering portion is connected with one end of the metal wire through the second through hole, and the second electrode is connected with the other end of the metal wire through the third through hole;

Step 104, forming a protective layer on the substrate formed with the patterns of the first electrodes, the second electrodes, the connecting portion, and the conductive covering portion, and forming a signal guiding connecting hole of the protective layer through the pattering process.

The method for manufacturing the touch panel in another embodiment of the present invention includes:

forming patterns of first electrodes, second electrodes, a connecting portion and conductive covering portion on the substrate by the pattering process;

on the substrate formed with the patterns of the first electrodes, the second electrodes, the connecting portion and the conductive covering portion, forming a pattern of an insulating layer, the insulating layer provided with a first through hole opposite to the first electrode, a second through hole adjacent to the first through hole, and a third through hole opposite to the second electrode, the hole wall of the first through hole provided with a first sharp corner, the hole wall of the second through hole provided with a second sharp corner which is arranged to face to the first sharp corner;

on the substrate formed with the pattern of the insulating layer, forming patterns of a metal bridge and a metal wire by the patterning process, the metal bridge used for lapping adjacent first electrodes through the first through hole on the insulating layer, one end of the metal wire is connected with the conductive covering portion through the second through hole on the insulating layer, and the other end is connected with the second electrode through the third through hole on the insulating layer;

forming a protective layer on the substrate formed with the patterns of the metal bridge and the metal wire, and forming signal guiding connecting hole of the protective layer by the pattering process.

It can be seen that, the touch panel of the embodiments of the present invention, compared to the existing technique in the prior art in the manufacturing process, does not need additional mask patterning processes. The manufacturing process of the embodiment shown in FIG. 8 is as follows:

cleaning the glass substrate;

depositing a metal molybdenum (Mo) layer using the magnetron sputtering method;

exposing the metal molybdenum (Mo) layer by the first mask, and developing, wet etching it to form patterns of the metal bridge and the metal wire;

depositing the silicon nitride insulating layer by using the chemical vapor deposition;

exposing the insulating layer by the second mask, and developing, dry etching it to form patterns of the first through hole, the second through hole, and the third through hole;

depositing the indium tin oxide (ITO) layer by using the magnetron sputtering method;

exposing the indium tin oxide (ITO) layer by the third mask, and developing, wet etching it to form patterns of the first electrodes, the second electrodes, the connecting portion, and the covering portion;

depositing the protective layer using the chemical vapor deposition, wherein the material of the protective layer may also be the silicon nitride;

exposing the protective layer by the forth mask, and developing, dry etching it to form a pattern of the signal guiding connecting hole.

It is obvious that various modifications and variations of the embodiments may be made by those skilled in the art without departing from the spirit and scope of the present invention. In this way, if those modifications and variations of the embodiments of the present invention fall in the scope of the claims and its equivalent technologies of the present invention, it is intended that the present invention will include those modifications and variations.

What is claimed is:

1. A touch panel including on a substrate: a first electrode wire, a second electrode wire, and an insulating layer, the second electrode wire being intersected with the first electrode wire, and separated from the first electrode wire by the insulating layer at the intersection, wherein, the first electrode wire comprises first electrodes and a metal bridge, the metal bridge is arranged at the intersection and is used for lapping adjacent first electrodes through a first through hole on the insulating layer, and the hole wall of the first through hole is provided with a first sharp corner;

the second electrode wire comprises second electrodes, a connecting portion, a metal wire, and a conductive covering portion, the connecting portion is arranged at the intersection and is used for connecting adjacent second electrodes, one end of the metal wire is connected with the conductive covering portion through a second through hole on the insulating layer, the other end of the metal wire is connected with the second electrodes through a third through hole on the insulating layer, and the hole wall of the second through hole is provided with a second sharp corner which is arranged to face the first sharp corner, wherein charges are released from the first sharp corner and the second sharp corner to the second electrode wire according to a point discharge principle when electrostatic charges are accumulated on the first electrode wire.

2. The touch panel according to claim 1, wherein the metal bridge is provided with a third sharp corner, and the connecting portion is provided with a forth sharp corner which is arranged to face the third sharp corner.

3. The touch panel according to claim 1, wherein there are at least two pairs of the first sharp corners and the second sharp corners, and the first sharp corner and the second sharp corner in any one of the at least two pairs are arranged to face to each other.

4. The touch panel according to claim 2, wherein there are at least two pairs of the third sharp corners and the forth sharp corners, and the third sharp corner and the forth sharp corner in any one of the at least two pairs are arranged to face to each other.

5. The touch panel according to claim 1, wherein the metal bridge and the metal wire are formed on the substrate, the insulating layer covers on the metal bridge and the metal wire, and the first electrodes, the second electrodes, the connecting portion and the conductive covering portion are formed on the insulating layer.

6. The touch panel according to claim 1, wherein the first electrodes, the second electrodes, the connecting portion, and the conductive covering portion are formed on the substrate, the insulating layer covers on the first electrodes, the second electrodes, the connecting portion, and the conductive covering portion, and the metal bridge and the metal wire are formed on the insulating layer.

7. The touch panel according to claim 1, wherein the first electrode wire is a driving transparent electrode wire and the second electrode wire is a detecting transparent electrode wire, or, the first electrode wire is a detecting transparent electrode wire and the second electrode wire is a driving transparent electrode wire.

8. A touch display device including the touch panel according to claim 1.

9. A method for manufacturing the touch panel according to claim 1, including:

forming patterns of a metal bridge and a metal wire on a substrate by a patterning process;

on the substrate formed with the patterns of the metal bridge and the metal wire, forming a pattern of an insulating layer by the patterning process, the insulating layer being provided with first through holes respectively opposite to two ends of the metal bridge, a second through hole and a third through hole respectively opposite to two ends of the metal wire, the hole wall of each of the first through holes being provided with a first sharp corner, the hole wall of the second through hole being provided with a second sharp corner which is arranged to face the first sharp corner;

on the substrate formed with the pattern of the insulating layer, forming patterns of first electrodes, second electrodes, a connecting portion, and a conductive covering portion by the patterning process, adjacent first electrodes being connected with the metal bridge through the first through holes, adjacent second electrodes being connected by the connecting portion, the conductive covering portion being connected with one end of the metal wire through the second through hole, the second electrode being connected with the other end of the metal wire through the third through hole;

forming a protective layer on the substrate formed with the patterns of the first electrodes, the second electrodes, the connecting portion, and the conductive covering portion, and forming a signal guiding connecting hole of the protective layer by the patterning process, wherein charges are released from the first sharp corner and the second sharp corner to the second electrode wire according to a point discharge principle when electrostatic charges are accumulated on the first electrode wire.

10. A method for manufacturing the touch panel according to claim 1, including:

forming patterns of first electrodes, second electrodes, a connecting portion and a conductive covering portion on a substrate by a patterning process;

on the substrate formed with the patterns of the first electrodes, the second electrodes, the connecting portion, and the conductive covering portion, forming a pattern of an insulating layer by the patterning process, the insulating layer being provided with a first through hole opposite to one of the first electrodes, a second through hole adjacent to the first through hole, and a third through hole opposite to one of the second electrodes, the hole wall of the first through hole being provided with a first sharp corner, and the second through hole being provided with a second sharp corner which is arranged to face the first sharp corner;

on the substrate formed with the pattern of the insulating layer, forming patterns of a metal bridge and a metal wire by the patterning process, the metal bridge being used for lapping adjacent first electrodes through the first through hole on the insulating layer, one end of the metal wire being connected with the conductive covering portion through the second through hole on the insulating layer, the other end being connected with the one of the second electrodes through the third through hole on the insulating layer;

forming a protective layer on the substrate formed with the patterns of the metal bridge and the metal wire, and forming a signal guiding connecting hole of the protective layer by the patterning process, wherein charges are released from the first sharp corner and the second sharp corner to the second electrode wire according to a point discharge principle when electrostatic charges are accumulated on the first electrode wire.

11. The touch panel according to claim 1, wherein the connecting portion, the conductive covering portion, the first electrodes, and the second electrodes are made of the same material.

\* \* \* \* \*